United States Patent [19]

Sayles, Sr.

[11] Patent Number: 4,680,138

[45] Date of Patent: Jul. 14, 1987

[54] SILVER SENSING MATERIAL FOR USE ON FILM

[76] Inventor: Delbert E. Sayles, Sr., 3814 N. 88th St., Omaha, Nebr.

[21] Appl. No.: 790,247

[22] Filed: Oct. 22, 1985

[51] Int. Cl.$^4$ .......................... H01B 1/04; H01B 1/02
[52] U.S. Cl. .................... 252/503; 252/510; 252/512; 252/514; 106/311; 106/1.18; 106/1.19
[58] Field of Search ............... 252/503, 510, 514, 512; 106/311, 1.18, 1.19; 524/439, 440

[56] References Cited

U.S. PATENT DOCUMENTS 4,391,742  7/1983  Steigerwald et al. ............... 252/512
4,446,059  5/1984  Eustice .................................. 252/514

*Primary Examiner*—Josephine L. Barr
*Attorney, Agent, or Firm*—Harvey B. Jacobson

[57] ABSTRACT

The concentration of conductive metal in a paint composition is reduced to the range of 20–30% by weight by the addition of Toluene to Butyl Acetate at a weight ratio thereto of approximately 1:3 in the liquid vehicle portion of the paint.

7 Claims, No Drawings

SILVER SENSING MATERIAL FOR USE ON FILM

BACKGROUND OF THE INVENTION

This invention relates to conductive paint compositions and more particularly to a composition directly applied to substrate surfaces so as to form an electrically conductive coating thereon.

The application of conductive coatings to various surfaces such as tapes, film, circuit boards and the like is already well known. Often film or tape is coated with adhesive metallic foil to produce a sensing signal during movement. Such film coatings occasionally crack and are responsible for other problems such as jamming of sprocket driving teeth because of foil overlap of sprocket holes. Application of a conductive coating by means of a liquid paint could avoid the sprocket hole overlap problem, but paint compositions heretofore utilized often crack in response to substrate surface flexure and deteriorate rather rapidly with use because of abrasion and wear.

Conductive paint compositions that are directly applied and air dried are, of course, well known for coating surfaces more compatible thereto such as circuit boards. Such a paint is marketed by G-C Electronics of Rockford, Ill., a division of Hydro-Metals, Inc. When such paint is applied it leaves a coating of silver in a liquid binder formed by Butyl Acetate. This paint composition is known to consist of approximately 43% by weight of silver and 57% by weight of Butyl Acetate and has not been heretofore successfully used to conductively coat tapes or film.

One reason discovered for the lack of success in the use of a silver paint on film, is the excessive concentration of the silver in the liquid vehicle. Although Butyl Acetate as the liquid vehicle for the silver is advantageous in that it is not flammable in a dried state and is non-toxic, it is difficult to remove from the film by use of solvents and when its content in the paint composition is increased to thin the paint or decrease the silver concentration, the paint drying time is excessively prolonged.

It is therefore an important object of the present invention to provide an improved conductive paint composition that is particularly useful for marking of film and also useful for coating many other types of substrate surfaces on which it is desired to apply an electrically conductive layer.

SUMMARY OF THE INVENTION

In accordance with the present invention, it was discovered that the aforementioned commercially available silver paint may be thinned to reduce the concentration therein of the silver to approximately 30% by adding a predetermined amount of the solvent Toluene to the liquid vehicle. As a result, the paint drying time was unexpectedly reduced to 60 to 90 seconds. Further, removal of the dried coating when desired by use of solvents was facilitated without film damage. The desirable attributes of the Butyl Acetate alone, such as surface adhesion, non-toxicity and non-inflammability, were retained. It was also discovered from testing that electrical contact was improved by buffing and remained intact over a long period of time despite wear. Another attribute particularly significant for movie camera film was the lack of any adverse affect thereon by light. The light resistance quality was found to be further enhanced by the addition of carbon to the paint composition.

DESCRIPTION OF THE PREFERRED EMBODIMENTS

From a chemical analysis of the conductive paint composition formulated in accordance with one embodiment of the invention, by adding Toluene to the aforementioned commercially available silver paint, the following examples of the invention are specified.

EXAMPLE 1

In this example, all percentages are stated by weight with respect to the entire composition

| Ingredient | Percentages |
| --- | --- |
| Silver liquid vehicle | 23.1 |
| Butyl Acetate | 58.5 |
| Toluene | 18.4 |

The foregoing percentages were empirically determined to provide a silver paint of optimum quality for coating of film.

EXAMPLE 2

| Ingredient | Percentages |
| --- | --- |
| Silver liquid vehicle | 11.5 |
| Butyl Acetate | 29.3 |
| Toluene | 9.2 |
| carbon | 50.00 |

Other examples of the invention are contemplated, in which the conductive metal is a mixture of equal parts of silver and aluminum. Also, gold may replace the silver.

It will also be apparent from the foregoing examples that the optimum percentage of Toluene in the liquid vehicle itself is 23.9% or at a ratio of approximately 1:3 to the Butyl Acetate. The paint formulations described herein could be modified to vary the conductive metal concentration within a range of 20 to 30% by weight. At the lower end of this range, plural coats of paint may be necessary to obtain the desired metal coating. At the upper end of the range, a single coat of paint would suffice.

It should be appreciated that variations may be made in procedures, proportions and materials without departing from the scope of the invention as defined by the following claims.

What is claimed as new is as follows:

1. In a paint composition comprising a conductive metal, selected from the group consisting of silver, gold and aluminum, suspended in Butyl Acetate as a liquid vehicle, the improvement comprising approximately 23.9% by weight of Toluene in the liquid vehicle, the conductive metal being 20 to 30% by weight of the composition.

2. The composition of claim 1 wherein the conductive metal is 11.5–23.1% by weight of silver.

3. The composition of claim 2 including 50% by weight of carbon.

4. In a paint composition consisting of 11.5 to 23.1% by weight of silver suspended in a liquid vehicle, the improvement comprising between 9.2% and 18.4% by weight of Toluene in the composition, said liquid vehicle consisting of Butyl Acetate and the Toluene.

5. The composition of claim 4 wherein the conductive metal is a mixture of aluminum and silver.

6. In a paint composition consisting of 20–30% by weight of a conductive metal in a liquid vehicle, the improvement residing in 100% of said liquid vehicle consisting of a mixture of Butyl Acetate and Toluene at a weight ratio of approximately three to one, the conductive metal being selected from the group consisting of silver, gold and aluminum.

7. The composition claim 6 wherein said conductive metal is silver.

* * * * *